(12) United States Patent
Krajewski

(10) Patent No.: US 8,951,824 B1
(45) Date of Patent: Feb. 10, 2015

(54) ADHESIVES FOR ATTACHING WIRE NETWORK TO PHOTOVOLTAIC CELLS

(75) Inventor: Todd Krajewski, Mountain View, CA (US)

(73) Assignee: Apollo Precision (Fujian) Limited, Fujian Province (CN)

( * ) Notice: Subject to any disclaimer, the term of this patent is extended or adjusted under 35 U.S.C. 154(b) by 606 days.

(21) Appl. No.: 13/082,709

(22) Filed: Apr. 8, 2011

(51) Int. Cl.
H01L 51/40 (2006.01)
(52) U.S. Cl.
USPC ........... 438/67; 438/57; 135/256; 257/E31.11
(58) Field of Classification Search
USPC .......... 136/244, 256; 257/E31.11; 438/67, 57
See application file for complete search history.

(56) References Cited

U.S. PATENT DOCUMENTS

| | | |
|---|---|---|
| 3,459,391 A | 8/1969 | Haynos |
| 3,553,030 A | 1/1971 | Lebrun |
| 3,561,500 A | 2/1971 | Rentz et al. |
| 4,017,332 A | 4/1977 | James |
| 4,166,918 A | 9/1979 | Nostrand et al. |
| 4,346,159 A | 8/1982 | Sadamatsu et al. |
| 4,366,335 A | 12/1982 | Feng et al. |
| 4,560,498 A | 12/1985 | Horsma et al. |
| 4,567,642 A | 2/1986 | Dilts et al. |
| 4,598,306 A | 7/1986 | Nath et al. |
| 4,640,002 A | 2/1987 | Phillips et al. |
| 4,694,117 A | 9/1987 | Friedrich et al. |
| 4,849,133 A | 7/1989 | Yoshida et al. |
| 5,034,068 A | 7/1991 | Glenn et al. |
| 5,330,583 A | 7/1994 | Asai et al. |
| 5,391,235 A | 2/1995 | Inoue |
| 5,474,621 A | 12/1995 | Barnard |
| 5,554,229 A | 9/1996 | Vogeli |

(Continued)

FOREIGN PATENT DOCUMENTS

| | | |
|---|---|---|
| CA | 2718518 | 9/2009 |
| DE | 2757301 | 7/1979 |

(Continued)

OTHER PUBLICATIONS

Richards et al., "Enhancing the efficiency of production CdS/CdTe PV modules by overcoming poor spectral response at short wavelengths via luminescence down-shifting," 2006 IEEE 4th World Conference on Photovoltaic Energy Conversion, May 7-12, 2006, 4 pages.

(Continued)

Primary Examiner — Shaun Campbell
(74) Attorney, Agent, or Firm — Weaver Austin Villeneuve & Sampson LLP

(57) ABSTRACT

Provided are novel methods of fabricating photovoltaic modules using pressure sensitive adhesives (PSA) to secure wire networks of interconnect assemblies to one or both surfaces of photovoltaic cells. A PSA having suitable characteristics is provided near the interface between the wire network and the cell's surface. It may be provided together as part of the interconnect assembly or as a separate component. The interconnect assembly may also include a liner, which may remain as a part of the module or may be removed later. The PSA may be distributed in a void-free manner by applying some heat and/or pressure. The PSA may then be cured by, for example, exposing it to UV radiation to increase its mechanical stability at high temperatures, in particular at a, for example the maximum, operating temperature of the photovoltaic module. For example, the modulus of the PSA may be substantially increased during this curing operation.

19 Claims, 4 Drawing Sheets

(56) References Cited

U.S. PATENT DOCUMENTS

| | | | |
|---|---|---|---|
| 5,620,528 A | 4/1997 | Schade et al. | |
| 5,626,688 A | 5/1997 | Probst et al. | |
| 5,681,402 A | 10/1997 | Ichinose et al. | |
| 5,814,195 A | 9/1998 | Lehan et al. | |
| 6,093,581 A | 7/2000 | Takabayashi | |
| 6,093,884 A | 7/2000 | Toyomura et al. | |
| 6,121,542 A | 9/2000 | Shiotsuka et al. | |
| 6,132,585 A | 10/2000 | Midorikawa et al. | |
| 6,184,458 B1 | 2/2001 | Murakami et al. | |
| 6,231,732 B1 | 5/2001 | Hollars et al. | |
| 6,232,544 B1 | 5/2001 | Takabayashi | |
| 6,335,479 B1 | 1/2002 | Yamada et al. | |
| 6,365,010 B1 | 4/2002 | Hollars | |
| 6,372,538 B1 | 4/2002 | Wendt et al. | |
| 6,479,744 B1 | 11/2002 | Tsuzuki et al. | |
| 6,488,824 B1 | 12/2002 | Hollars et al. | |
| 6,531,653 B1 | 3/2003 | Glenn et al. | |
| 6,548,912 B1 | 4/2003 | Graff et al. | |
| 6,600,100 B2 | 7/2003 | Ho et al. | |
| 6,657,119 B2 | 12/2003 | Lindquist et al. | |
| 6,743,524 B2 | 6/2004 | Schaepkens | |
| 6,803,513 B2 | 10/2004 | Beernink et al. | |
| 6,974,976 B2 | 12/2005 | Hollars | |
| 7,544,884 B2 | 6/2009 | Hollars | |
| 8,138,413 B2 | 3/2012 | Luch et al. | |
| 8,356,640 B1 | 1/2013 | Nizenkoff et al. | |
| 2002/0014262 A1 | 2/2002 | Matsushita et al. | |
| 2002/0166580 A1 | 11/2002 | Bauman et al. | |
| 2004/0063320 A1 | 4/2004 | Hollars | |
| 2004/0069340 A1 | 4/2004 | Luch | |
| 2004/0144043 A1 | 7/2004 | Stevenson et al. | |
| 2004/0187917 A1* | 9/2004 | Pichler | 136/263 |
| 2005/0072461 A1 | 4/2005 | Kuchinski et al. | |
| 2005/0074915 A1 | 4/2005 | Tuttle et al. | |
| 2005/0109392 A1 | 5/2005 | Hollars | |
| 2005/0176270 A1 | 8/2005 | Luch | |
| 2005/0241692 A1 | 11/2005 | Rubin et al. | |
| 2006/0032752 A1 | 2/2006 | Luch | |
| 2006/0180195 A1 | 8/2006 | Luch | |
| 2007/0283996 A1 | 12/2007 | Hachtmann et al. | |
| 2007/0283997 A1 | 12/2007 | Hachtmann et al. | |
| 2007/0295385 A1 | 12/2007 | Sheats et al. | |
| 2008/0000518 A1 | 1/2008 | Basol | |
| 2008/0011350 A1 | 1/2008 | Luch | |
| 2008/0053511 A1 | 3/2008 | Nakamura | |
| 2008/0053519 A1 | 3/2008 | Pearce et al. | |
| 2008/0128018 A1 | 6/2008 | Hayes | |
| 2008/0142071 A1 | 6/2008 | Dorn et al. | |
| 2008/0213477 A1 | 9/2008 | Zindel et al. | |
| 2008/0314432 A1 | 12/2008 | Paulson et al. | |
| 2008/0314433 A1 | 12/2008 | Luch | |
| 2009/0014049 A1 | 1/2009 | Gur et al. | |
| 2009/0014057 A1 | 1/2009 | Croft et al. | |
| 2009/0014058 A1 | 1/2009 | Croft et al. | |
| 2009/0111206 A1* | 4/2009 | Luch | 438/59 |
| 2009/0199894 A1 | 8/2009 | Hollars et al. | |
| 2009/0235979 A1 | 9/2009 | Wudu et al. | |
| 2009/0297803 A1 | 12/2009 | Kriha et al. | |
| 2010/0043863 A1* | 2/2010 | Wudu et al. | 136/244 |
| 2010/0108122 A1 | 5/2010 | Everson et al. | |
| 2010/0122730 A1 | 5/2010 | Corneille et al. | |
| 2010/0130348 A1 | 5/2010 | Kang et al. | |
| 2010/0212733 A1 | 8/2010 | Schmidt et al. | |
| 2011/0143077 A1* | 6/2011 | Kakihara et al. | 428/67 |
| 2011/0197947 A1 | 8/2011 | Croft | |
| 2011/0207328 A1* | 8/2011 | Speakman | 438/694 |
| 2012/0000510 A1* | 1/2012 | Wiedeman et al. | 136/249 |
| 2012/0080079 A1 | 4/2012 | Corneille et al. | |
| 2012/0125393 A1 | 5/2012 | Austin et al. | |
| 2012/0138117 A1 | 6/2012 | Krajewski | |
| 2013/0276855 A1 | 10/2013 | Wudu et al. | |

FOREIGN PATENT DOCUMENTS

| | | |
|---|---|---|
| EP | 1868250 | 5/2010 |
| JP | 06-021501 | 1/1994 |
| JP | 07-099334 | 4/1995 |
| JP | 09-036404 | 2/1997 |
| JP | 10-093125 | 4/1998 |
| JP | 2000-269531 | 9/2000 |
| JP | 2004-253475 | 9/2004 |
| JP | 2005-129773 | 5/2005 |
| JP | 2006-041351 | 2/2006 |
| KR | 10-1999-006965 | 1/1999 |
| KR | 10-0242852 | 2/2000 |
| WO | 2010/056803 | 5/2010 |
| WO | 2012/047553 | 4/2012 |

OTHER PUBLICATIONS

Untila et al., "19.2% Efficient Bifacial ITO-(P+Nn+)Si-ITO Laminated Grid Cell", 16th European Photovoltaic Solar Energy Conference, May 1-5, 2000, Glasgow, UK, pp. 1489-1491.

U.S. Appl. No. 11/451,616, "Photovoltaic module with integrated current collection and interconnection", Hachtmann et al., filed Jun. 13, 2006.

U.S. Appl. No. 11/451,604, "Photovoltaic module with insulating interconnect carrier," Hachtmann et al., filed Jun. 13, 2006.

U.S. Appl. No. 11/451,604, Office Action mailed Sep. 4, 2009.

U.S. Appl. No. 11/451,604, Final Office Action mailed Apr. 1, 2010.

EP patent application No. 07252359.0, Examination Report mailed Jul. 10, 2008.

U.S. Appl. No. 12/052,476, "Interconnect assembly," Zerfu et al., filed Mar. 20, 2008.

WO patent application No. PCT/US2009/035486, International Search Report and Written Opinion, mailed Sep. 29, 2009.

U.S. Appl. No. 12/566,555, "Interconnect Assembly", Wudu et al., filed Sep. 24, 2009.

U.S. Appl. No. 12/272,600, "Power-loss-inhibiting current-collector", Corneille et al., filed Nov. 17, 2008.

U.S. Appl. No. 12/837,867, "Transparent conductive film-coated decals for solar cells", Corneille et al., filed Jul. 16, 2010.

U.S. Appl. No. 12/819,124, "Power-loss-inhibiting current collector having transparent current regulator", Corneille et al., filed Jun. 18, 2010.

U.S. Appl. No. 12/843,648, "Temperature resistant current collectors for thin film photovoltaic cells", Alex Austin, filed Jul. 26, 2010.

US patent application No. PCT/US2009/064125, International Search Report and Written Opinion, mailed May 24, 2010.

U.S. Appl. No. 12/272,600, Office Action mailed Apr. 14, 2011.

U.S. Appl. No. 12/897,162, "Small gauge wire solar cell interconnect", Corneille et al., filed Oct. 4, 2010.

U.S. Appl. No. 12/052,476, Office Action mailed Jan. 21, 2011.

U.S. Appl. No. 12/052,476, Office Action mailed Aug. 3, 2011.

U.S. Appl. No. 12/272,600, Office Action mailed Oct. 18, 2011.

U.S. Appl. No. 12/687,754, "Apparatuses and methods for fabricating wire current collectors and interconnects for solar cells", Nizenkoff et al., filed Jan. 14, 2010.

U.S. Appl. No. 12/915,882, "Apparatus and method for securing wire to decal", McKay et al., filed Oct. 29, 2010.

U.S. Appl. No. 13/085,274, "Thermoplastic wire network support for photovoltaic cells", Todd Krajewski, Apr. 12, 2011.

U.S. Appl. No. 13/087,724, "Wire network for interconnecting photovoltaic cells", Steven Croft, filed Apr. 15, 2011.

U.S. Appl. No. 13/087,730, "Interconnecting wire network with conductive tab", Steven Croft, filed Apr. 15, 2011.

U.S. Appl. No. 11/451,616, Office Action mailed Sep. 17, 2009.

U.S. Appl. No. 11/451,616, Final Office Action mailed Apr. 20, 2010.

U.S. Appl. No. 12/951,711, "Photovoltaic Device and Method and System for Making Photovoltaic Device," Austen, filed Nov. 22, 2010.

U.S. Appl. No. 12/052,476, Office Action mailed Mar. 16, 2012.

U.S. Appl. No. 12/052,476, Notice of Allowance mailed Jul. 18, 2012.

U.S. Appl. No. 12/566,555, Office Action mailed Feb. 16, 2012.

(56) References Cited

OTHER PUBLICATIONS

U.S. Appl. No. 13/114,999, "Apparatuses and Methods for Fabricating wire Current Collectors and Interconnects for Solar Cells," McKay et al., filed May 24, 2011.
U.S. Appl. No. 12/915,882, Office Action mailed Jul. 20, 2012.
International Search Report and Written Opinion mailed Apr. 24, 2012 for application No. PCT/US2011/052974.
U.S. Appl. No. 12/837,867, Office Action mailed Aug. 8, 2012.
U.S. Appl. No. 12/566,555, Office Action mailed Sep. 28, 2012.
U.S. Appl. No. 12/819,124, Office Action mailed Oct. 9, 2012.
U.S. Appl. No. 12/272,600, Office Action mailed Oct. 10, 2012.
U.S. Appl. No. 12/052,476, Office Action mailed May 31, 2013.
U.S. Appl. No. 13/850,976, "Interconnect Assembly", Wudu et al., filed Mar. 26, 2013.
Notice of Allowance dated Sep. 18, 2012, for U.S. Appl. No. 12/687,754.
Office Action dated Dec. 6, 2012, for U.S. Appl. No. 12/843,648.
Shimomura, JP 2006-041351A, Machine Translation.
Office Action mailed Jun. 7, 2013 for U.S. Appl. No. 12/897,162.
Huismann, et al., "The application of inverse titania opals in nanostructured solar cells," Jun. 1, 2004, Elsevier, Solar Energy Material & Solar Cells, 85 (2005), pp. 115-124.
Reynolds, Phillip John, "A Surly Ionomer as a self-healing and self-sensing composite," Dec. 2011, University of Bomingham, p. 10.
Sigma-Aldrich, Material Safety Data Sheet Poly (ethylene terephthalate), Dec. 18, 2012, Sigma-Aldrich, Version 4.2.
Sigma-Aldrich, Material Safety Data Sheet Poly (ethylene-co-matheacryilic acid), Jul. 20, 2010, Sigma-Aldrich, Version 4.0.
US Office Action mailed Aug. 1, 2013, issued in U.S. Appl. No. 13/085,274.
Kay, et al. Low Cost Photovoltaic Modules Based on Dye Sensitized Nanocrystalline Titanium Dioxide and Carbon Powder, Solar Energy Materials and Solar Cells, 1996, 19 pages.
DuPont, Teflon FEP 100 Material Safety Data Sheet, 2013, 2 pages.
U.S. Appl. No. 13/087,724, Office Action mailed Nov. 6, 2013.
U.S. Appl. No. 12/052,476, Office Action mailed Feb. 7, 2014.
U.S. Appl. No. 13/085,274, Office Action mailed Apr. 11, 2014.

* cited by examiner

US 8,951,824 B1

ADHESIVES FOR ATTACHING WIRE NETWORK TO PHOTOVOLTAIC CELLS

BACKGROUND

In the drive for renewable sources of energy, photovoltaic technology has assumed a preeminent position as a cheap and renewable source of clean energy. For example, photovoltaic cells using a Copper Indium Gallium Diselenide (CIGS) absorber layer offer great promise for thin-film photovoltaic cells having high efficiency and low cost. Of comparable importance to the technology used to fabricate thin-film cells themselves is the technology used to collect electrical current from the cells and to interconnect one photovoltaic cell to another to form a photovoltaic module.

Just as the efficiency of thin-film photovoltaic cells is affected by parasitic series resistances, photovoltaic modules fabricated from multiple cells are also impacted by parasitic series resistances and other factors caused by electrical connections to the absorber layer and other electrical connections within the modules. A significant challenge is the development of current collection and interconnection structures that improve the overall performance of the module. Moreover, the reliability of photovoltaic modules is equally important as it determines their useful life, cost effectiveness, and viability as reliable alternative sources of energy.

SUMMARY

Provided are novel methods of fabricating photovoltaic modules using pressure sensitive adhesives (PSAs) to secure wire networks of interconnect assemblies to one or both surfaces of photovoltaic cells. A PSA having suitable characteristics is provided near the interface between the wire network and the cell's surface. It may be provided together as part of the interconnect assembly or as a separate component. The interconnect assembly may also include a liner, which may remain as a part of the module or may be removed later. The PSA may be distributed in a void-free manner by applying some heat and/or pressure. The PSA may be then cured by, for example, exposing it to Ultra Violet (UV) radiation to increase its mechanical stability at high temperatures and, in particular, at the maximum operating temperature of the photovoltaic module. For example, the modulus of the PSA may be substantially increased during this curing operation.

In certain embodiments, a method of fabricating a photovoltaic module involves providing a photovoltaic cell comprising a surface, providing an interconnect wire network assembly having a conductive wire network, establishing an electrical contact between a portion of the conductive wire network and the surface of the photovoltaic cell, and stabilizing this with a pressure sensitive adhesive (PSA). The PSA is provided adjacent to an interface between the portion of the conductive wire network and the surface to provide mechanical support to the wire network with respect to the surface of the photovoltaic cell and to maintain the electrical contact. The method may also involve curing the PSA to increase its mechanical stability at an operating temperature of the photovoltaic module. In certain embodiments, curing involves exposing the PSA to a dose of UV radiation. In other embodiments, curing involves exposing the PSA to at least about 145° C. to increase cross-linking of the PSA. The PSA may include one or more of the following materials: a UV-reactive styrenic block copolymer, a cationic curing epoxy-functional liquid rubber, a saturated polyacrylate, an acrylate monomer, and an acrylate oligomer, and an acrylated polyester. The PSA may be provided as a part of the interconnect wire assembly comprises. In certain embodiments, an interconnect wire assembly includes a liner. The liner may be removed after curing the PSA.

A PSA may be used for attaching a conductive wire network to a front light incident surface of the photovoltaic cell or its back side surface. A wire network may include one or more wires having a gauge of between about 34 and 46. Establishing an electrical contact between the portion of the conductive wire network and the surface of the photovoltaic cell may involve passing a pre-aligned stack of the photovoltaic cells and the interconnect wire network assembly through a set of heated nip rollers. In the same or other embodiments, establishing an electrical contact between the portion of the conductive wire network and the surface of the photovoltaic cell involves heating the PSA to at least about 80° C. to allow the PSA to flow adjacent to the interface between the portion of the conductive wire network and the surface.

In certain embodiments, a PSA includes individual structures forming a pattern corresponding to individual wires of the conductive wire network. These individual structures do not completely extend over the surface of the photovoltaic cell in between the individual wires of the conductive wire network. For example, individual structures may be shells provided on wires of the wire network. PSA may provide initial mechanical support to a portion of the conductive wire network with respect to the surface of the photovoltaic cell prior to curing the PSA.

In certain embodiments, establishing an electrical contact between the portion of the conductive wire network and the surface of the photovoltaic cell involves forcing the interconnect wire network assembly that contains the PSA against the surface of the cell. This force may redistribute the PSA provided around individual wires of the conductive wire network. In certain embodiments, an operating temperature of the photovoltaic module corresponds to a predetermined maximum operating temperature. In the same or other embodiments, an operating temperature of the photovoltaic module is at least about 120° C.

Provided also a method of fabricating a photovoltaic module. The method may involve providing a photovoltaic cell including a surface, providing an interconnect wire network assembly including a conductive wire network, and establishing an electrical contact between a portion of the conductive wire network and the surface of the photovoltaic cell. A pressure sensitive adhesive (PSA) is redistributed adjacent to an interface between the portion of the conductive wire network and the surface and provides support to the portion of the conductive wire network with respect to the surface. The PSA may be a non-Newtonian PSA or a thixotropic PSA provided as a part of the interconnect wire network assembly. In these embodiments, establishing the electrical contact between the portion of the conductive wire network and the surface of the photovoltaic cell involves applying a pressure between the interconnect wire network assembly and the photovoltaic cell to redistribute the thixotropic PSA adjacent to the interface. The PSA may also be a thermoplastic PSA provided as a part of the interconnect wire network assembly. In these embodiments, establishing the electrical contact between the portion of the conductive wire network and the surface of the photovoltaic cell involves heating the PSA to at least a predetermined temperature to redistribute the thermoplastic PSA adjacent to the interface.

Provided also a photovoltaic module including a first photovoltaic cell having a front side surface, a second photovoltaic cell having a back side surface, a conductive wire network having a first portion and a second portion. The first portion of the network is in electrical contact with the front side surface of the first photovoltaic cell, while the second portion is in electrical contact with the back side surface of the second photovoltaic cell. The module also includes a first PSA provided adjacent to a first interface between the first portion of the conductive wire network and the front side surface of the first photovoltaic cell. The first PSA may have a sufficient mechanical stability to support the first portion of the conductive wire network with respect to the front side surface of the first photovoltaic cell at an operating temperature of the photovoltaic module. In certain embodiments, the module also includes a second PSA provided adjacent to a second interface between the second portion of the conductive wire network and the back side surface of the second photovoltaic cell, wherein the second PSA has a sufficient mechanical stability to support the second portion of the conductive wire network with respect to the back side surface of the second photovoltaic cell at an operating temperature of the photovoltaic module.

These and other features are described further below with reference to the figures.

DETAILED DESCRIPTION OF EXAMPLE EMBODIMENTS

Figure 1:
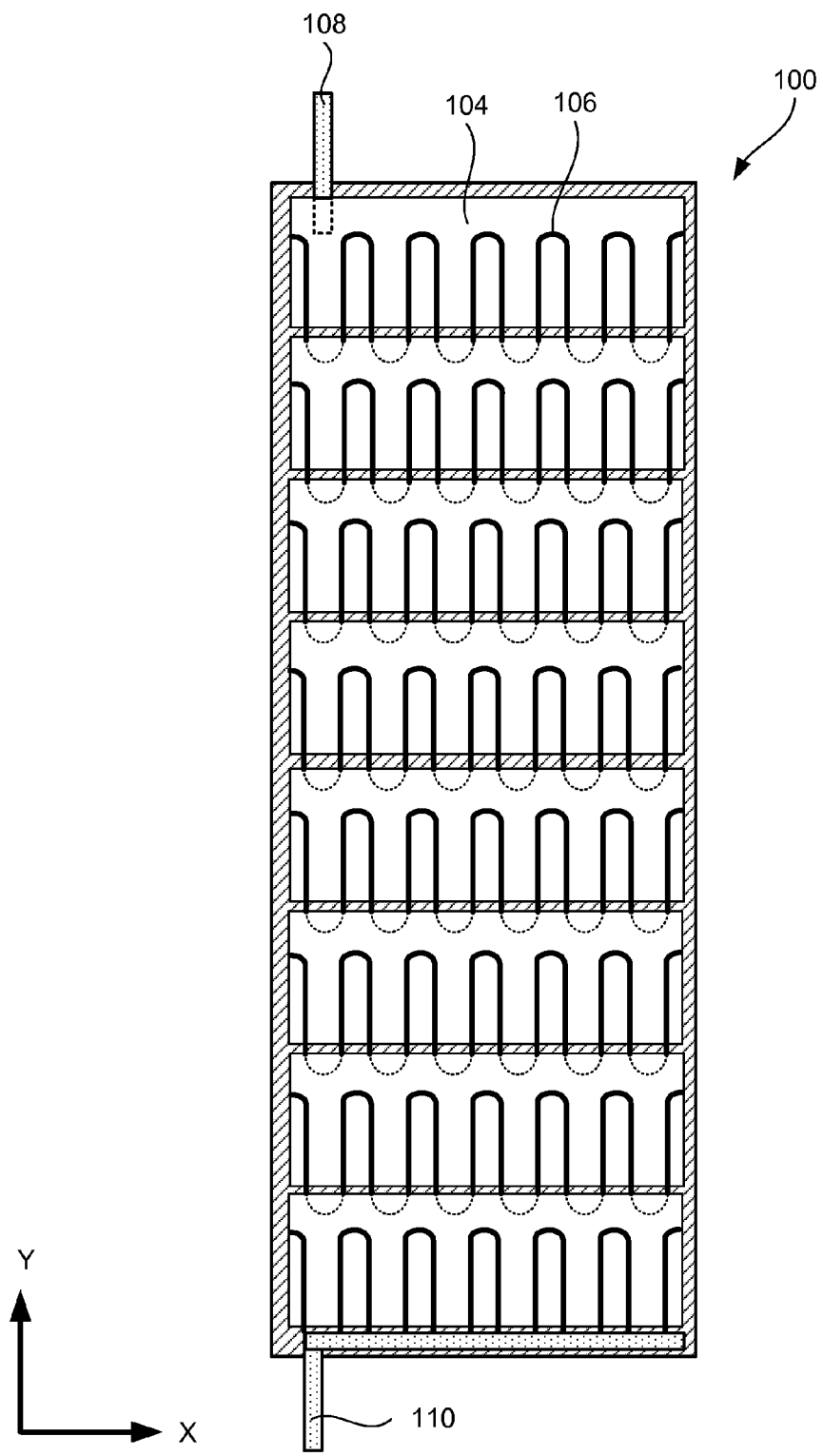
FIG. 1 is a schematic representation of a photovoltaic module having multiple photovoltaic cells electrically interconnected using interconnect wire network assemblies, in accordance with certain embodiments.

In the following description, numerous specific details are set forth in order to provide a thorough understanding of the present invention. The present invention may be practiced without some or all of these specific details. In other instances, well known process operations have not been described in detail so as to not unnecessarily obscure the present invention. While the invention will be described in conjunction with the specific embodiments, it will be understood that it is not intended to limit the invention to the embodiments.

Making electrical connections to the front and back surfaces of a photovoltaic cell, for example a Copper Indium Gallium Diselenide (CIGS) cell, can be challenging. Not only do these electrical connections need to have a relatively low electrical resistance and meet various rigorous requirements specific to photovoltaic modules (e.g., minimize light shading of the front surface), but these connections also have to withstand harsh operating conditions over the entire operating lifetime of the photovoltaic module. For example, photovoltaic modules continuously go thought temperature cycles during their operation (e.g., between high temperatures during a hot, sunny day and low temperatures during a cold night). The temperature difference in a single day may exceed more than 100° C. These differences may be even more over a typical year (e.g., adding seasonal temperature fluctuations) and over the entire operating lifetime. The temperature fluctuation may be further amplified by various designs of photovoltaic module. For example, some rigid modules may be supported using metal brackets and positioned at a distance from the roof surface allowing for ventilation and cooling. Flexible and building integrable photovoltaic modules may have very little or no gap between back surfaces of the modules and supporting structures and, therefore, may get even hotter during the day.

These electrical connections to the front and back surfaces may be made using interconnect wire network assemblies. The assemblies include wire networks, each wire network including one or more wires (e.g., a serpentine shaped wire or multiple substantially parallel wires). A portion of the wire network is placed in direct contact with a front surface or a back surface of the cell during module fabrication. The other portion of the wire network may be connected to another cell or other electrical components of the module. In certain embodiments, one portion of the network is placed in direct contact with a front surface of one cell, and another portion of the same network is placed in direct contact with a back surface of another cell. In these embodiments, this network provides an in-series electrical connection between these two cells. Other types of connections are possible as well, such as parallel connections or a combination of in-series and parallel connections. In certain embodiments, an interconnect assembly acts as a current collector from a less conductive surface of the photovoltaic cell, such as a front surface containing transparent conductive oxide.

A wire network may be supported with respect to a surface of the photovoltaic cells using various polymer materials. For example, a polymer material may be provided adjacent to the interface between the wire network and the surface. The polymer material may be bonded to both the wire network and surface by melting the material or having some initial tackiness. However, this support has to be maintained during the entire operating lifetime of the photovoltaic module and be resistant to all temperature fluctuations experienced by the module, some of which are highlighted above. At the same time, various module components may have very different coefficients of thermal expansion (CTEs) and may cause mechanical stresses during these temperature fluctuations. Some of these stresses may force wires of the wire network to separate from the surface of the photovoltaic cell. Furthermore, some polymer materials may soften at elevated temperatures and effectively let the wire move under the stress. This phenomenon is sometimes referred to as "wire floating." Wire floating can be detrimental to cell performance by causing losses of electrical connections and the degradation of cell performance.

It has been found that wire floating may be substantially reduced, and module performance substantially improved, by using more robust polymer materials to support wire networks with respect to the photovoltaic cells. Specifically, materials that have higher melting temperatures and/or glass transition temperatures may be used. In certain embodiments, suitable materials have melting temperatures exceeding an operating temperature of the module, for example the maximum operating temperature. In the same or other embodiments, the melting temperature of suitable materials is at least about 90° C. or, more specifically, of at least about 100° C. or even at least about 110-120° C.

While these materials may help to reduce the wire floating phenomena, materials that require high temperatures during initial application and later processing may still be challenging to work with and expensive to process. For example, attachment of the wire network to a surface may be obtained by some redistribution of a polymer material used for bonding. This, in turn, may require significant heating of the polymer material to substantially reduce its viscosity and allow it to flow in order for the redistribution to occur in a substantially void-free manner. Voids are highly undesirable in the photovoltaic modules and may cause mechanical stresses and other problems in the module. Furthermore, if a polymer material is not capable of providing some initial bonding between the cell and the wire network prior to the redistribution described above, then this heating may need to occur after these two components are aligned. Many high temperature polymer materials are not sufficiently "tacky" at room temperature to bond to other materials. Suitable tackiness can be obtained by heating, and some heating may be used, particularly localized heating, heating to lower temperatures, and heating for short periods of time. But additional heating may complicate processing.

It has been found that mechanical bonds and electrical connections may be established between various components of the interconnect wire network assembly and photovoltaic cell without a need for complex heating schemes. Instead, a set of polymer materials has been identified and tested for photovoltaic applications. Some of these polymer materials fall into a class of PSA. Some PSA materials have initial tackiness even at room temperature. Such materials may be used to provide initial bonding of wire networks to cells without an immediate need for heating and other specific processing techniques. Furthermore, PSA materials have particular non-Newtonian or thixotropic characteristics and become less viscous when a shear force is applied to these materials. Such materials may flow under pressure applied during module assembly without a need for excessive heating but remain relatively stable even at high temperatures during module operation.

Finally, some PSA materials may be cured to change their thermal or rheological characteristics or, more specifically, their mechanical strength and stability at high temperatures. For example, a PSA material having good room temperature tack may be initially applied near the wire-surface interface. Some heating may be provided during this fabrication stage to improve wet-out and flow, but the temperature does not need to be high. For example, the PSA material may be heated to a processing temperature that is substantially lower than the maximum operating temperature of the photovoltaic module. Yet, this processing temperature may still sufficient for the PSA material to flow in a substantially void free manner. The PSA material can then be then cured by exposing it to UV radiation, e-beam radiation, high temperature, or some other curing conditions to change the thermal/rheological properties of the PSA material. Specifically, the mechanical stability at an operating temperature of the photovoltaic module, for example the maximum operating temperature, may be substantially increased during this curing operation. This may correspond to an increase in modulus, shear resistance, and glass transition temperature of the PSA material. Without being restricted to any particular theory, some PSA materials may increase their cross-linking upon being subjected to various curing techniques. More cross-linked polymers tend to have higher modulus/shear resistance and are generally more mechanically stable at an operating temperature of the photovoltaic module, for example the maximum operating temperature.

To provide a better understanding and context for methods of fabricating photovoltaic modules and various features of module components, such as interconnect wire network assemblies and cell surfaces, some examples of photovoltaic modules in accordance with embodiments of the present invention will now be described in more detail. FIG. 1 is a schematic top view of photovoltaic module 100, in accordance with certain embodiments. Module 100 includes multiple (photovoltaic cells 104 electrically interconnected using interconnect wire network assemblies 106. Specifically, all cells 104 shown in FIG. 1 are electrically interconnected in series such that each cell pair has one interconnect assembly extending aver a front surface of one cell and extending under a back surface of another cell. Module 100 shown in FIG. 1 includes eight photovoltaic cells 104 that are interconnected using seven assemblies 106. However, it will be understood by one having ordinary skill in the art that any number of cells may be positioned within one module. In certain embodiments, a module has at least 10 cells or, more specifically, at least 15 cells interconnected in series. In particular embodiments, a module has 22 cells interconnected in series. Furthermore, a module may have multiple interconnected sets of cells such that the sets are further connected with each other. For example, a module may include two sets, with each set including 22 interconnected cells.

Multiple cells or sets of cells may be interconnected in series to increase an output voltage of the module, which may be driven by current transmission and other requirements. For example, a typical voltage output of an individual CIGS cell is between 0.4V and 0.7V. Modules built from CIGS cells are often designed to provide voltage outputs of at least about 20V and even higher voltage ratings. In addition to interconnecting multiple cells in series, a module may include one or more module-integrated inverters to regulate its voltage output. Interconnect assemblies may be also used to connect multiple cells in parallel or various combinations of the two connection schemes (i.e., parallel and in-series connection schemes).

Each interconnect assembly 106 illustrated in FIG. 1 includes a serpentine-shaped wire extending across the length of photovoltaic cell 104 (direction X). Bottom portions (with respect to the module orientation in FIG. 1) of the serpentine-shaped wire extend under lower cells to make electrical connections to the back sides of these cells. These portions are illustrated with dashed lines. In certain embodiments these portions may also include conductive tabs welded to the wires in order to increase the surface contact area with the back sides of the cells. A top portion of each wire is shown to extend over a front side of a cell and making an electrical connection to the front side.

Most interconnect assemblies 106 extend both over a front side of one cell and under a back side of an adjacent lower cell. From a photovoltaic cell perspective, most cells 104 have one interconnect assembly 106 extending over its front side and another extending under its back side. However, some end-cells (e.g., the top-most cell in FIG. 1) may have only one interconnect wire network assembly 106 extending over one of their sides, typically over their front sides. In these embodiments, bus bars or other electrical components of the module may be electrically coupled directly to another side of such cells, typically their backsides. For example, FIG. 1 illustrates a portion of top bus bar 108 extending under and connecting directly to the back side of the top cell without any intermediate interconnect assemblies. Still, some end-cells (e.g., the bottom cell in FIG. 1) may be in contact with two interconnect wire network assemblies 106. A bottom bus bar 110 is shown electrically coupled to one of these assemblies 106 or, more specifically, to the assembly 106 extending over the front side of the bottom cell. Bottom bus bar 110 may be electrically coupled to this assembly 106 using a number of coupling techniques that are generally not suitable for coupling to the cell, such as welding and soldering.

In certain embodiments, a front surface of the cell includes one or more transparent conductive oxides (TCO), such as zinc oxide, aluminum-doped zinc oxide (AZO), indium tin oxide (ITO), and gallium doped zinc oxide. The layer forming this surface is typically referred to as a top conductive layer or a top layer. A typical thickness of the top conductive layer is between about 100 nanometers to 1,000 nanometers or, more specifically, between about 200 nanometers and 800 nanometers, with other thicknesses within the scope. The top conductive layer provides an electrical connection between the photovoltaic layer (positioned underneath the top conductive layer) and portions of the interconnect assembly. Due to the limited conductivity of the top conductive layer, wires of the assembly typically extend over the entire front surface of the cell. Furthermore, the wires may be distributed substantially uniformly at least in the area overlapping with the front surface.

In the same or other embodiments, a back surface of the cell includes a conductive substrate supporting the photovoltaic layer as well as collecting electrical current from this layer. Some examples of a photovoltaic layer or stack include CIGS cells, cadmium-telluride (Cd—Te) cells, amorphous silicon (a-Si) cells, microcrystalline silicon cells, crystalline silicon (c-Si) cells, gallium arsenide multi-junction cells, light adsorbing dye cells, and organic polymer cells. However, other types of photovoltaic stacks may be used as well. While interconnect assemblies generally do not make direct connections to the stack, various characteristics of the photovoltaic stack create specific requirements for the design of the interconnect assemblies. Some examples of conductive substrates include stainless steel foil, titanium foil, copper foil, aluminum foil, beryllium foil, a conductive oxide deposited over a polymer film (e.g., polyamide), a metal layer deposited over a polymer film, and other conductive structures and materials. In certain embodiments, a conductive substrate has a thickness of between about 2 mils and 50 mils (e.g., about 10 mils), with other thicknesses also within the scope. Generally, a substrate is sufficiently conductive such that a uniform distribution of an assembly's components (e.g., wires) adjacent to the substrate is not needed.

As described above, portions of interconnect wire network assemblies are electrically coupled to the front and/or back surfaces of the photovoltaic cells. This coupling is typically provided by direct mechanical contact between wires of the networks and the surfaces. The mechanical contact may be stabilized by bonding these surfaces and wires to other components, such as adhesive materials provided as a part of the assemblies or as separate components. In this way, support is provided for establishment and maintenance of the contact. For example, adhesive materials may be provided on a liner as a part of the assembly (as further described below with reference to FIGS. 2 and 3), as a coating on wires of the wire network, or as a coating over the wire network after it establishes a contact with the photovoltaic cell.

Figure 2:
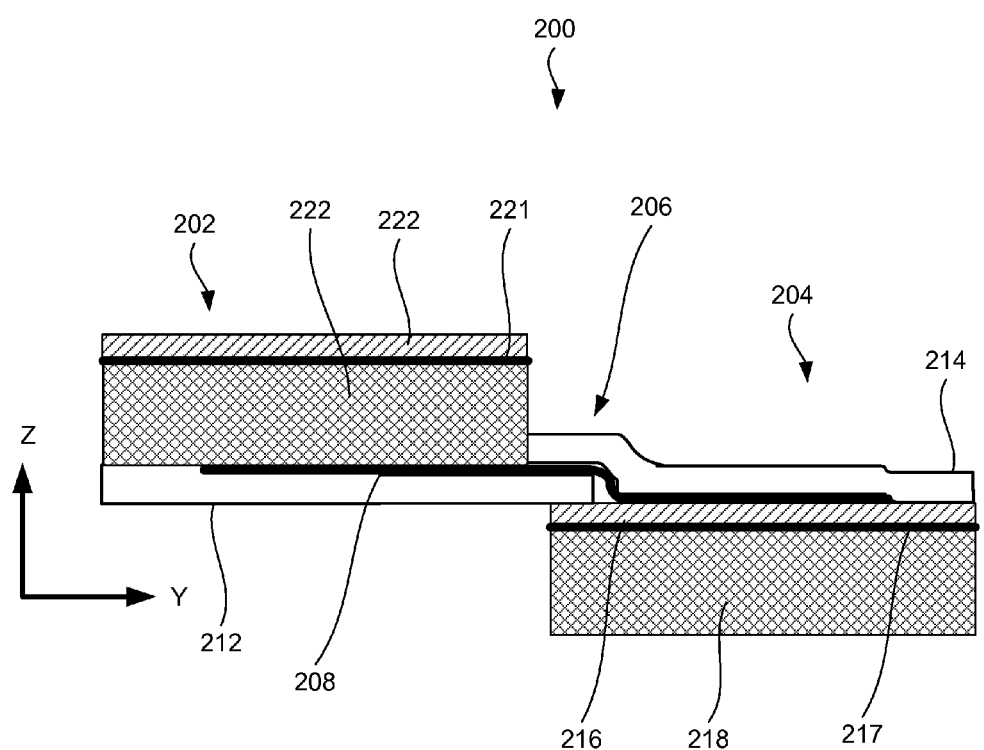
FIG. 2 is a schematic side view of two photovoltaic cells interconnected using a wire network assembly, in accordance with certain embodiments.

FIG. 2 illustrates a schematic side view of a module portion 200 that includes two photovoltaic cells 202 and 204 electrically interconnected using an assembly 206, in accordance with certain embodiments. Cell 202 includes a substrate layer 222 supporting a photovoltaic layer 221 and a top layer 222. Similarly, cell 204 includes a substrate layer 218 supporting a photovoltaic layer 217 and a top layer 216. Assembly 206 includes one or more wires forming a wire network 208, a bottom carrier structure 212, and a top carrier structure 214. Top carrier structure 214 attaches a portion of wire network 208 to top layer 216 of cell 204 in order to make an electrical connection between these two components or, more specifically, between wires of network 208 and the front side surface of top layer 216. This connection may require a certain overlap (in direction Y) between wire network 208 and top layer 216, the extent of which generally depends on the electrical properties of top layer 216.

Bottom carrier structure 212 attaches another portion of wire network 208 to bottom substrate layer 222 of cell 202 in order to make an electrical connection between these two components or, more specifically, between wires of network 208 and the bottom surface of substrate layer 222. Substrate layer 222 may have higher conductivity than a corresponding top layer. As such, wire network 208 may not need to overlap as much with substrate layer 222 as with the top layer as described above.

Carrier structures used for attaching interconnect assemblies to photovoltaic cells may have various designs and configurations. Generally, a carrier structure includes at least some PSA material. In a fully fabricated module, the PSA material may be arranged as a continuous layer or multiple individual patches. Furthermore, in a fully fabricated module, the carrier structure may include a liner. An example a module with a continuous PSA layer and a liner is further described below with reference to FIG. 3. In other embodiments, a liner may be initially provided as a carrier for the PSA material but them removed. Finally, a PSA material may be provided without a liner, for example, as a wire coating or as a melt (or as a solution) deposited over an arrangement including the wire network that is in contact with a surface of the photovoltaic cell.

FIG. 3 is a schematic cross-sectional view of a wire network 306 attached to a surface 302 of photovoltaic cell 301 using a carrier structure 307, in accordance with certain embodiments. Surface 302 may represent either the front side surface (i.e., the light-incident surface) or the back side surface (i.e., the substrate surface). Depending on the type of the surface, wire network 306 and portions of carrier structure 307 will contact different types of materials, such as transparent conductive oxide or metallic substrate. In certain embodiments, the materials of the carrier structure 307 may be specifically tailored to the requirements of the surface 302.

Carrier structure 307 includes a PSA layer 304 and a liner 308. Liner 308 may be used as a temporary carrier for PSA layer 304 and may be removed in later operations. Such liners are referred to as "release liners" and generally may be made from any type of material suitable for carrying and releasing PSA materials. For example, a liner may be a thin polymer film, a metal foil, or any other suitable material. Alternatively, liner 308 may remain as a part of the fully fabricated module. In these embodiments, liner 308 is generally made from electrically insulating materials. When such liners are used over front light-incident sides of cells, the liners should also be substantially transparent to allow sunlight to reach the photovoltaic layer. Some examples of suitable liner materials include thermoplastic materials, such as polyethylene terephthalate (PET), polyethylene naphthalate PEN, polyethylene-co-tetrafluoroethylene (ETFE), polyamide, polyetherimide (PEI), polyetheretherketone (PEEK), or combinations of these.

Figure 3A:
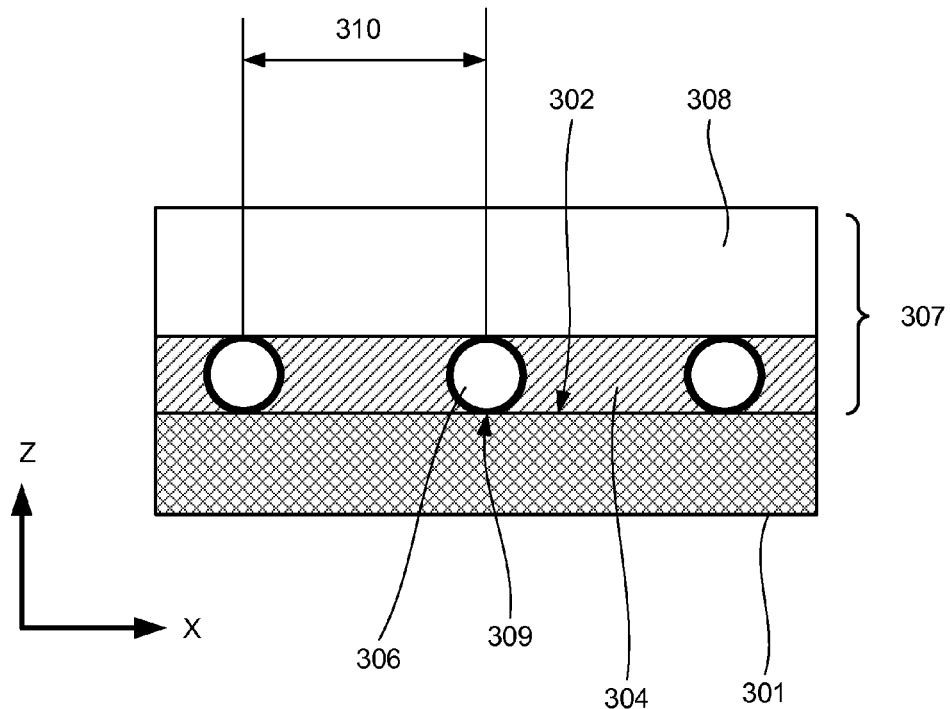
FIGS. 3A and 3B are schematic cross-sectional views of an interconnect wire network assembly attached to a surface of the photovoltaic cell, in accordance with certain embodiments.
Figure 3B:
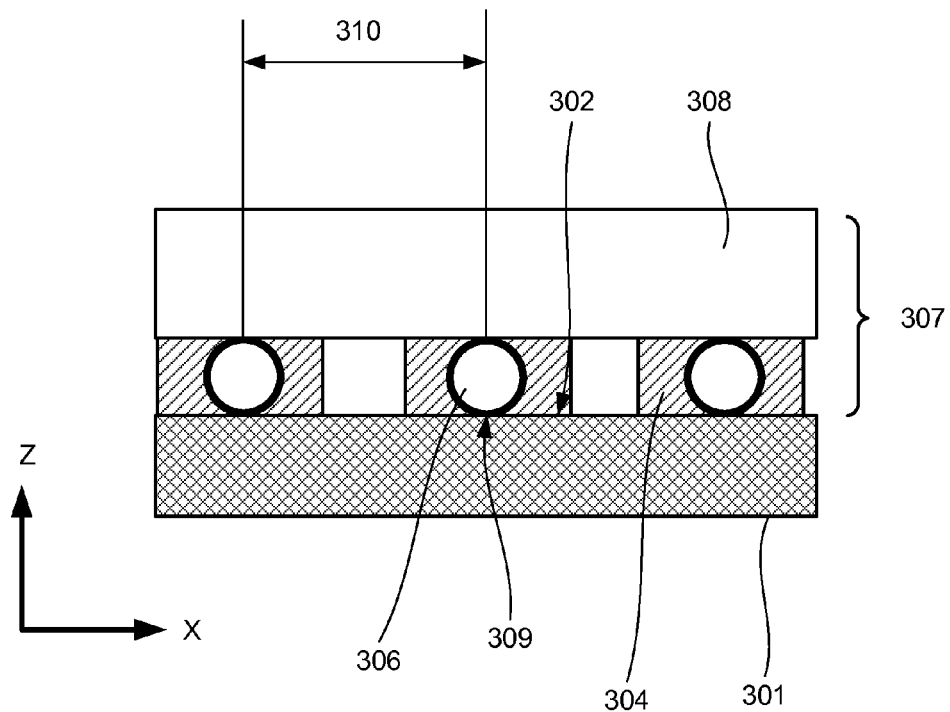

PSA layer 304 may be a continuous layer, as shown in FIG. 3A, or a collection of individual patches, as shown in FIG. 3B. The individual patches may be positioned adjacent to the wire-surface interfaces 309 but may not fully cover the surface of the cell in between the wires. The patches provided on a carrier liner should align with individual wires of the wire network to ensure adhesion of these wires to the cell's surface. A patched PSA layer is typically present in the final module assembly without a corresponding liner to prevent voids in between the liner and the cell's surface in the areas where the PSA patches are not present. In certain embodiments, patches of PSA are combined with patches of some other material to form a continuous layer, which may be used together with a liner.

PSA materials used for fabrication of a photovoltaic module may have specific initial properties that assist with distribution of these materials in a void free manner during some initial operations of the fabrication process. In certain embodiments, some initial properties are changed during fabrication to improve the bond between the wire network and the cell's surfaces. Some materials that are capable of changing their properties include "dual stage" PSA materials. For example, some dual stage PSA materials increase their cross-linking between polymer chains upon being subjected to certain curing techniques. These changes may be evident from an increase in modulus, shear resistance and/or glass transition temperatures. Specifically, some PSA materials may be cured using UV radiation. Examples of such PSA materials include a UV-reactive styrenic block copolymer, a cationic curing epoxy-functional liquid rubber, a saturated polyacrylate, and an acrylated polyester. In other embodiments, some PSA materials may be cured by being exposed to a high temperature for a relatively short period of time. Examples of such materials include peroxide cured acrylates. In yet other embodiments, some PSA materials have specific thixotropic characteristics, such that they become less viscous and can flow at room temperature (or some slightly elevated temperature) upon applying a certain shear force. Yet these materials remain mechanically stable at much higher temperatures when no or lower shear forces are applied. Examples of such materials include acrylate based PSA's supplied by Adhesive Research in Glen Rock, Pa. and MACtac Global in Stow, Ohio.

An initial thickness of PSA layer 304 is generally comparable to a cross-sectional dimension of the wires in wire network 306 (e.g., a diameter of the round wires or a thickness of the flat wires). In certain embodiments, the initial thickness is between about 25% and 100% of the cross-sectional dimension of the wires or, more specifically, about 50%. Various examples of wires that may be used for wire network 306 and their respective dimensions are described below. It should be noted that initially provided PSA materials may change their shape during fabrication. Therefore, the initial layer thickness may change. Furthermore, PSA materials may be provided in shapes other than a layer and later redistributed into a layer shape.

Wire network 306 may include one or more wires that are uniformly distributed within a predetermined wire boundary. For example, each network may include one serpentine-shaped wire (as shown in FIG. 1) or multiple parallel wires spaced apart along direction X. Arrangements of one or more wires in the network may be characterized by a pitch 310, which, for purposes of this document, is defined as a distance between the centers of two adjacent wires or two adjacent portions of the same wire. The pitch 310 determines the distance electrical current travels through the surface layers of the cells prior to reaching the conductive wires. Reducing the pitch increases the current collection characteristics of the interconnect assembly. However, a smaller pitch also decreases the useful front surface area of the cell by covering the photovoltaic layer with non-transparent wires and causes more dense topography, which may be prone to voids and other imperfections. In certain embodiments, pitch 310 is between about 2 millimeters and 5 millimeters (e.g., about 3.25 millimeters), though other distances may be used, as appropriate.

Wires of wire network 306 are typically made from thin, highly conductive metal stock and may have round, flat, and other shapes. Examples of wire materials include copper, aluminum, nickel, chrome, or alloys thereof. In some embodiments, a nickel coated copper wire is used. In certain embodiments, the wire is 24 to 56 gauge, or in particular embodiments, 32 to 56 gauge (for example, 40 to 50 gauge). In specific embodiments, the wire has a gauge of 34, 36, 40, 42, 44, or 46. Additional wire examples are described in U.S. patent application Ser. No. 12/843,648, entitled "TEMPERATURE RESISTANT CURRENT COLLECTORS FOR THIN FILM PHOTOVOLTAIC CELLS," filed Jul. 26, 2010, which is incorporated herein by reference in its entirety for purposes of describing additional wire examples.

Figure 4:
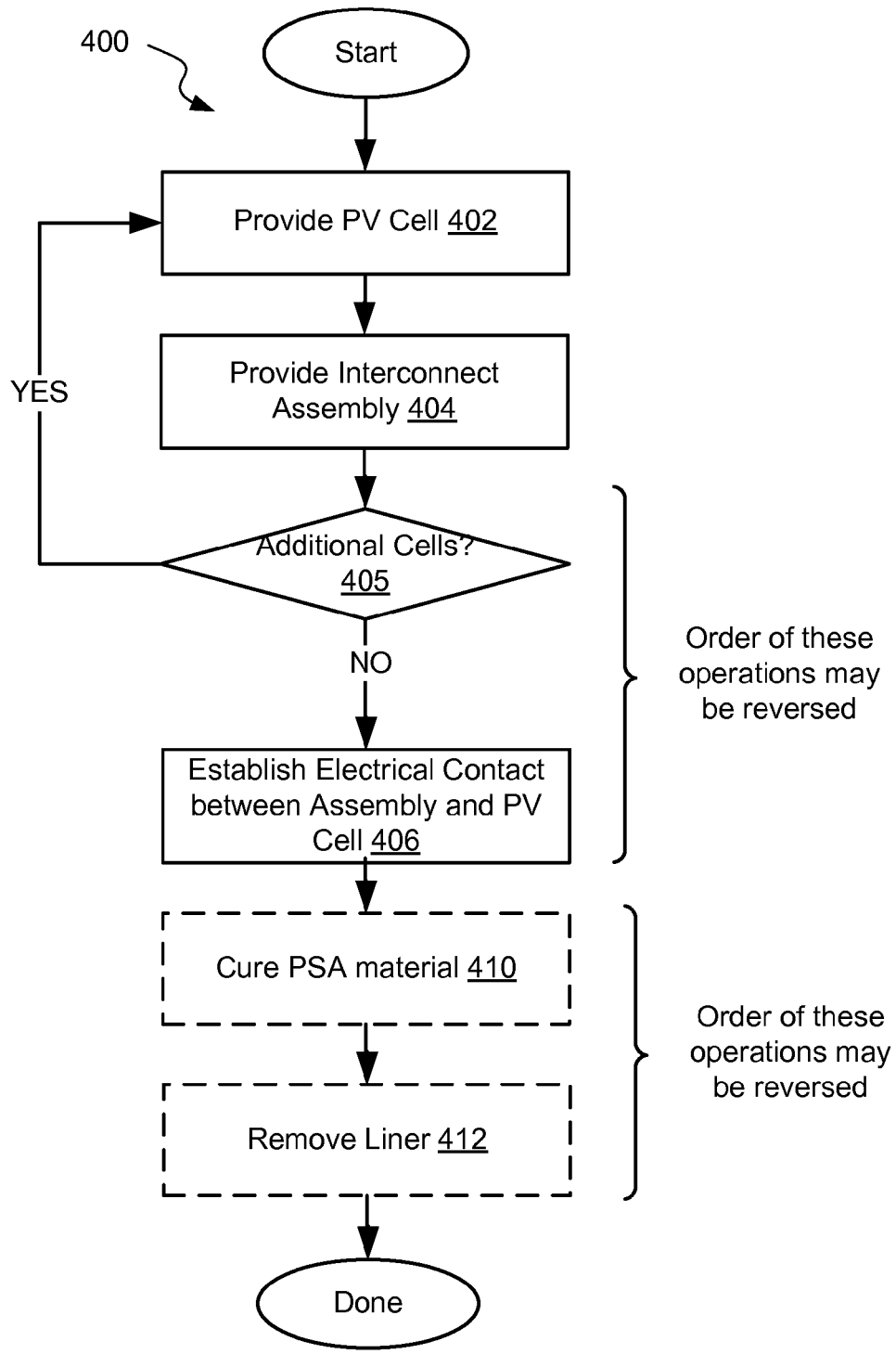
FIG. 4 illustrates a process flowchart corresponding to a method of fabricating a photovoltaic module, in accordance with certain embodiments.

FIG. 4 illustrates a flowchart corresponding to a process 400 for fabricating a photovoltaic module, in accordance with certain embodiments. Process 400 may start with providing one or more photovoltaic cells, in operation 402, and providing one or more interconnect wire network assemblies, in operation 404. Various examples of photovoltaic cells and assemblies are described above. The provided interconnect assembly includes at least a wire network. It may also include a PSA material and/or a liner. A PSA material may also be provided in later operations. Operations 402 and 404 may be repeated (decision block 405) to provide additional photovoltaic cells and/or interconnect assemblies. For example, all photovoltaic cells and interconnect assemblies of the module may be aligned during these initial operations prior to establishing bonds between the cells and assemblies. In certain embodiments, a photovoltaic cell provided in operation 402 may already be bonded to an interconnect assembly provided in operation 404. In later operations, this interconnect assembly may be bonded to another cell, and this cell may be bonded to another interconnect assembly.

Process 400 may proceed with establishing an electrical contact between a wire network of the interconnect assembly and a surface of the corresponding photovoltaic cell, in operation 406. If a PSA material is provided as apart of the assembly, then operation 406 may also involve redistributing some PSA material to allow the electrical contact to occur. During this redistribution some PSA material can be positioned at the wire-surface interface. For example, the PSA material (and perhaps some other components) may be heated to a predetermined temperature to allow the PSA material to flow. In certain embodiments, a melting temperature of the PSA provided in process 400 (i.e., prior to the curing operation) is less than 80° C. or even less than 60° C. These PSA materials may be easily heated by heating the overall structure, including the cells and various components of the interconnect wire network assembly. Alternatively, the heating may be localized by, for example, passing an electrical current though wires of the wire networks and resistively heating the wires. The PSA material may be heated above its melting temperature during this operation. In the same or other embodiments, the PSA is heated to at least about 80° C. or, more specifically, to at least about 100° C. Other rheological and flow properties can be used to characterize these materials as well.

In the same or other embodiments, an interconnect assembly may be pressed against the surface of the photovoltaic cell during operation 406. This operation may be performed as a single-step operation using a heated roller or a two-step operation first using a cold roller for establishing initial tack and then using a hot roller to flow the material. This pressure helps to remove the PSA material from the wire-surface interface (i.e., the "contact" interface) and make an electrical contact between the wires and the surface. This pressure may also help the PSA material to fill the voids and/or form stronger bonds (e.g., achieve more "wetting") between the PSA material and wires and between the PSA material and cell surface. In certain embodiments, after redistribution of the PSA material, there are substantially no voids between the PSA material and the wires and between the PSA materials and the cell surface. If a liner is used, then redistribution of the PSA material may also be designed to eliminate substantially all voids in between the liner and the cell surface.

In certain embodiments, operation 406 involves coating the cell surface, which has a wire network disposed over this surface, with a PSA material. The PSA material may be provided in a molten form or a dissolved form (e.g., a highly polar solvent). The PSA material may also be partially cured in operation 406. Additional curing may be provided in later operations. In certain embodiments, the PSA material has an initial tackiness to provide some support to the wire network with respect to the cell. Overall, after completion of operation 406, the PSA may provide at least some initial mechanical support to the wire network with respect to the cell's surface regardless of how this initial support or bonds are established (tackiness, heating, pressure, or a combination of these methods).

Process 400 may continue with an optional operation 410 during which the PSA material is cured. The curing may change the internal structure and physical characteristics of the PSA material; for example, the curing may increase the PSA material's mechanical stability at a maximum operating temperature of the photovoltaic cell. This may correspond to an increased modulus, shear resistance or other rheological changes and/or glass transition temperature, which may rise above a certain predetermined level defined by the operating conditions of the photovoltaic module.

One example of a curing technique is UV radiation. A dosage of UV radiation can be easily controlled in a product environment so that an adequate curing level is achieved. In certain embodiments, the dose is between 0.1 W/cm$^2$ and 6 W/cm$^2$, which depends on the formulation, the photo-initiator used, and other factors. While some curing may be desirable for various reasons as explained above, excessive cross linking may turn the initial PSA into a brittle material that may not be suitable for photovoltaic applications. Another example of a curing technique involves exposure of the PSA material to an elevated temperature. For example, some PSA materials may be exposed to a temperature of at least about 145° C. to increase their polymer cross-linking.

Process 400 may also involve removing a liner in an optional operation 412. As stated above, a liner may be provided in one of the earlier operations as a temporary carrier of the wire network and/or PSA material. In certain designs, a liner may not be needed to provide final support to the wire network. The PSA material may be designed to provide all the mechanical support needed after performing various operations as described above.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A method of fabricating a photovoltaic module, the method comprising:
   providing a photovoltaic cell comprising a surface;
   providing an interconnect wire network assembly comprising a conductive wire network;
   establishing an electrical contact between a portion of the conductive wire network and the surface of the photovoltaic cell;
   stabilizing the electrical contact between a portion of the conductive wire network and the surface of the photovoltaic cell with a pressure sensitive adhesive (PSA) provided adjacent to an interface between the portion of the conductive wire network and the surface to provide mechanical support to the wire network with respect to the surface of the photovoltaic cell and to maintain the electrical contact; and
   curing the PSA to increase mechanical stability of the PSA at an operating temperature of the photovoltaic module, wherein the PSA comprises individual structures forming a pattern corresponding to individual wires of the conductive wire network and wherein the individual structures do not completely extend over the surface of the photovoltaic cell in between the individual wires of the conductive wire network.

2. The method of claim 1, wherein curing of the PSA comprises exposing the PSA to a dose of UV radiation.

3. The method of claim 1, wherein the PSA comprises one or more of the following materials: a UV-reactive styrenic block copolymer, a cationic curing epoxy-functional liquid rubber, a saturated polyacrylate, an acrylate monomer, and an acrylate oligomer, and an acrylated polyester.

4. The method of claim 1, wherein the provided interconnect wire assembly comprises the PSA.

5. The method of claim 4, wherein the provided interconnect wire assembly further comprises a liner.

6. The method of claim 5, further comprising removing the liner after curing the PSA.

7. The method of claim 1, wherein curing comprises exposing the PSA to at least about 145° C. to increase cross-linking of the PSA.

8. The method of claim 1, wherein the surface is a front light incident surface of the photovoltaic cell.

9. The method of claim 1, wherein the wire network comprises one or more wires having a gauge of between about 34 and 46.

10. The method of claim 1, wherein establishing an electrical contact between the portion of the conductive wire network and the surface of the photovoltaic cell comprises passing a pre-aligned stack of the photovoltaic cells and the interconnect wire network assembly through a set of heated nip rollers.

11. The method of claim 1, wherein establishing an electrical contact between the portion of the conductive wire network and the surface of the photovoltaic cell comprises heating the PSA to at least about 80° C. to allow the PSA to flow adjacent to the interface between the portion of the conductive wire network and the surface.

12. The method of claim 1, wherein the PSA provides initial mechanical support to the portion of the conductive wire network with respect to the surface of the photovoltaic cell prior to curing the PSA.

13. The method of claim 1, wherein establishing the electrical contact between the portion of the conductive wire network and the surface of the photovoltaic cell comprises forcing the interconnect wire network assembly comprising the PSA against the surface.

14. The method of claim 13, wherein the PSA is redistributed around individual wires of the conductive wire network during establishing the electrical contact between the portion of the conductive wire network and the surface of the photovoltaic cell comprises.

15. The method of claim 1, wherein the operating temperature of the photovoltaic module corresponds to a predetermined maximum operating temperature.

16. The method of claim 1, wherein the operating temperature of the photovoltaic module is at least about 120° C.

17. A method of fabricating a photovoltaic module, the method comprising:
- providing a photovoltaic cell comprising a surface;
- providing an interconnect wire network assembly comprising a conductive wire network; and
- establishing an electrical contact between a portion of the conductive wire network and the surface of the photovoltaic cell such that a PSA is redistributed adjacent to an interface between the portion of the conductive wire network and the surface and provides support to the portion of the conductive wire network with respect to the surface,
- wherein the PSA comprises individual structures forming a pattern corresponding to individual wires of the conductive wire network and wherein the individual structures do not completely extend over the surface of the photovoltaic cell in between the individual wires of the conductive wire network.

18. The method of claim 17, wherein the PSA is a non-Newtonian PSA or a thixotropic PSA provided as a part of the interconnect wire network assembly; and
- wherein establishing the electrical contact between the portion of the conductive wire network and the surface of the photovoltaic cell comprises applying a pressure between the interconnect wire network assembly and the photovoltaic cell to redistribute the thixotropic PSA adjacent to the interface.

19. The method of claim 17, wherein the PSA is a thermoplastic PSA provided as a part of the interconnect wire network assembly; and
- wherein establishing the electrical contact between the portion of the conductive wire network and the surface of the photovoltaic cell comprises heating the PSA to at least a predetermined temperature to redistribute the thermoplastic PSA adjacent to the interface.

\* \* \* \* \*